(12) United States Patent
Doyle et al.

(10) Patent No.: US 8,512,585 B2
(45) Date of Patent: Aug. 20, 2013

(54) TEMPLATE PILLAR FORMATION

(75) Inventors: Gary F. Doyle, Round Rock, TX (US); Gerard M. Schmid, Rensselaer, NY (US); Michael N. Miller, Austin, TX (US); Douglas J. Resnick, Leander, TX (US); Dwayne L. LaBrake, Cedar Park, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 13/352,824

(22) Filed: Jan. 18, 2012

(65) Prior Publication Data

US 2012/0111832 A1 May 10, 2012

Related U.S. Application Data

(63) Continuation of application No. 12/367,661, filed on Feb. 9, 2009, now abandoned.

(60) Provisional application No. 61/027,150, filed on Feb. 8, 2008.

(51) Int. Cl.
*C23F 1/00* (2006.01)

(52) U.S. Cl.
USPC .............. 216/47; 249/187.1; 216/40; 216/41; 216/60; 438/694

(58) Field of Classification Search
USPC .................. 216/40, 41, 47, 60, 59; 257/629; 428/446; 430/313, 314, 320, 5, 7; 438/291, 438/439, 592, 594, 627, 671, 678, 694, 703, 438/717, 763; 96/12
See application file for complete search history.

(56) References Cited

U.S. PATENT DOCUMENTS

| | | | |
|---|---|---|---|
| 4,658,496 A * | 4/1987 | Beinvogl et al. | 438/227 |
| 5,032,491 A * | 7/1991 | Okumura et al. | 430/314 |
| 6,264,851 B1 * | 7/2001 | Markovich et al. | 216/39 |
| 6,366,639 B1 * | 4/2002 | Ezaki et al. | 378/34 |
| 2003/0104702 A1 * | 6/2003 | Wu | 438/694 |
| 2003/0127426 A1 * | 7/2003 | Chang et al. | 216/41 |
| 2003/0205657 A1 * | 11/2003 | Voisin | 249/187.1 |
| 2004/0033424 A1 * | 2/2004 | Talin et al. | 430/5 |
| 2004/0087152 A1 * | 5/2004 | Lian et al. | 438/689 |
| 2006/0046161 A1 * | 3/2006 | Yin et al. | 430/5 |

* cited by examiner

*Primary Examiner* — Duy Deo
*Assistant Examiner* — Erin Bergner
(74) *Attorney, Agent, or Firm* — Cameron A. King; Michael D. Carter; Fish & Richardson, P.C.

(57) ABSTRACT

Methods for forming an imprint lithography template are provided. Materials for forming the imprint lithography template may be etched at different rates based on physical properties of the layers. Additionally, reflectance of the materials may be monitored to provide substantially uniform erosion of the materials.

20 Claims, 6 Drawing Sheets

TEMPLATE PILLAR FORMATION

CROSS-REFERENCE TO RELATED APPLICATIONS

This application is a continuation U.S. application Ser. No. 12/367,661 filed Feb. 9, 2009, which claims the benefit under 35 U.S.C. §119(e)(1) of U.S. provisional No. 61/027,150 filed on Feb. 8, 2008; both of which are hereby incorporated by reference.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. patent publication no. 2004/0065976, U.S. patent publication no. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
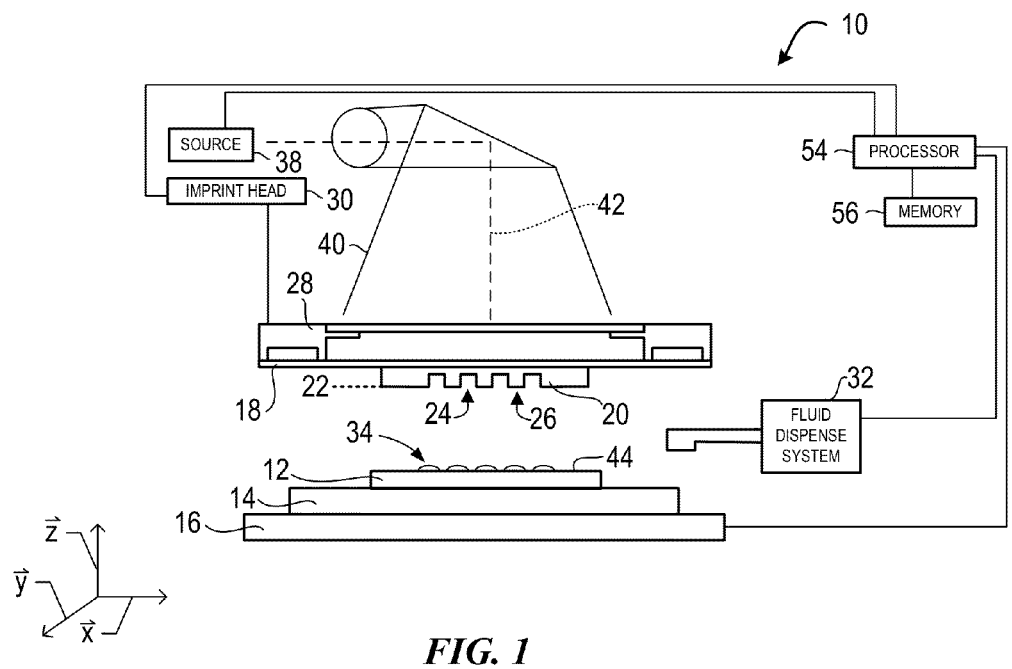
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. For example, polymerizable material 34 may be positioned upon substrate 12 using techniques such as those described in U.S. patent publication no. 2005/0270312 and U.S. patent publication no. 2005/0106321, both of which are hereby incorporated by reference herein. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. patent publication no. 2005/0187339, both of which are hereby incorporated by reference herein.

Figure 2:
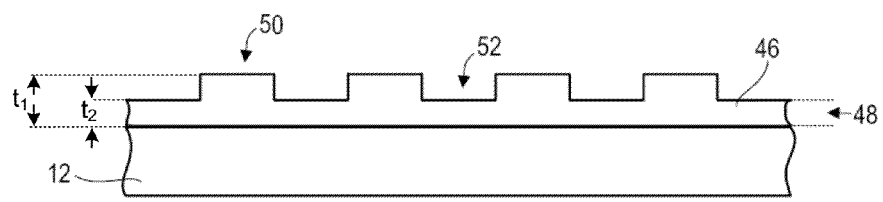
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage may be configured to position template 18 and substrate 12 in superimposition with path 42.

System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. patent publication no. 2004/0124566, U.S. patent publication no. 2004/0188381, and U.S. patent publication no. 2004/0211754, all of which are hereby incorporated by reference herein.

FIGS. 3-12 illustrate an exemplary method of forming imprint lithography template 18 for use in system 10. Generally, template 18 may be formed by disposing a conducting layer 62 on a substrate layer 60. A resist layer 64 may be disposed over conducting layer 62 and patterned (e.g., electron-beam lithography). A hard mask layer 66 may then be disposed over resist layer 64A. Additionally, a planarizing layer 68 may be disposed over resist layer 64 and/or hard mask layer 66 to provide a substantially planar top surface. Plasma etching processes may then be used to transfer the pattern into substrate layer 60.

Figure 3:
FIGS. 3-12 illustrate an exemplary method of forming an imprint lithography template.

Referring to FIG. 3, conducting layer 62 may be disposed on substrate layer 60. Substrate layer 60 may be formed of materials including, but not limited to quartz, silicon, organic polymers, siloxane polymers, borosilicate glass, fluorocarbon polymers, metal, hardened sapphire, and/or the like. Generally, substrate layer 60 may be formed with a high quality optical surface with low roughness and/or defects. For example, substrate layer 60 may be formed having a 20/10 scratch/dig ratio. Substrate layer 60 may have a thickness $t_3$. Thickness $t_3$ of substrate layer 60 may be substantially uniform. The magnitude of thickness $t_3$ may be between approximately 0.1 to 10 mm. A lesser magnitude of thickness $t_3$ of substrate layer 60 may provide for substrate layer 60 and/or template 18 to be capable of flexing and/or deforming during the imprinting process. For example, thickness $t_3$ may be approximately 1 mm.

Conducting layer 62 may be disposed on substrate layer 60 and is generally capable of being etched by a plasma etching process. Conducting layer 62 may have a thickness $t_4$. Thickness $t_4$ may be between approximately 1 to 10 nm. For example, conducting layer 62 may have a thickness $t_4$ of 5 nm. Conducting layer 62 may be formed of materials including, but not limited to, tantalum, tantalum nitride, tantalum silicide, tungsten, tungsten nitride, silicon carbide, amorphous silicon, chromium, chromium nitride, molybdenum, molybdenum silicide, titanium, titanium nitride, and/or the like.

Figure 4:
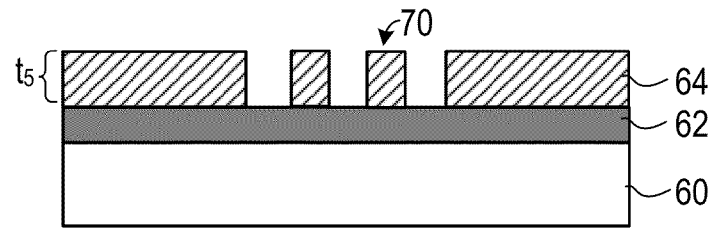

Referring to FIG. 4, resist layer 64 may be disposed on substrate layer 60 and/or conducting layer 62. Resist layer 64 may have a thickness $t_5$. Thickness $t_5$ may be between approximately 5 to 150 nm. For example, resist layer 64 may have a thickness $t_5$ of 45 nm. Thickness $t_5$ may be selected to obtain a desired patterning resolution. For example, the magnitude of thickness $t_5$ of resist layer 64 may be approximately 100 nm in circumstances that may be suitable for patterning structures with lateral dimensions of 50 nm. Alternatively, the magnitude of thickness $t_5$ of resist layer 64 may be approximately 50 nm in circumstances that may be suitable for patterning structures with lateral dimensions of 25 nm.

Resist layer 64 may be formed of materials including, but not limited to, imprint resist material, novolac-type photoresists, acrylate photoresists, epoxy photoresists, bilayer resist materials, and/or the like. Generally, resist layer 64 may be formed of positive-tone electron beam resist such as, for example, ZEP520A manufactured by Zeon Corporation, with an office located in Tokyo, Japan, or 950 k MW PMMA electron beam resist, and/or the like.

Resist layer 64 may be patterned to provide one or more features 70. For example, resist layer 64 may be exposed in an electron beam lithography tool to pattern features 70. An exemplary electron beam lithography tool is the VB6HR, manufactured by Vistec Lithography, Inc., with an office located in Watervliet, N.Y. The exposure pattern may consist of 25 nm diameter dots on a pitch of 50 nm. Resist layer 64 may be developed to obtain optimal resolution and/or process window. After development, un-exposed regions of resist layer 64 form features 70.

In one example, using ZEP520A, resist layer 64 may be developed and features 70 formed by immersing resist layer 64 in amyl acetate at a temperature between approximately −15 to 25 degrees Celsius for approximately 5 to 90 seconds.

In another example, using PMMA, resist layer 64 may be developed and features 70 formed by immersing resist layer 64 in a mixture of isopropyl alcohol and water at a temperature between approximately −15 to 25 degrees Celsius for approximately 5 to 90 seconds. It should be noted that ultrasonic agitation (e.g., approximately 30 to 50 kHz) may be used during development.

Figure 5A:
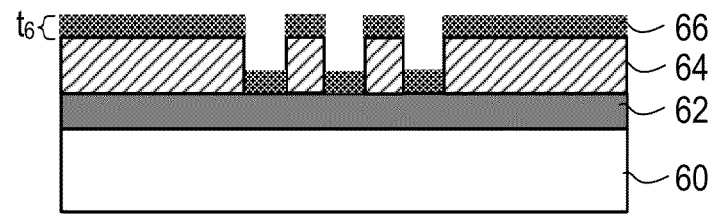
Figure 5B:
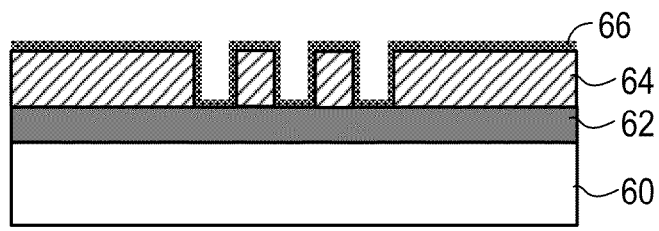

Referring to FIGS. 5A and 5B, hard mask layer 66 may be disposed on resist layer 64 by processes including, but not limited to, sputtering, evaporation, and the like. For example, thermal evaporation and e-beam evaporation may be used. Hard mask layer may be disposed on portions of resist layer 64 as illustrated in FIG. 5A or disposed on the entire resist layer 64 as illustrated in FIG. 5B.

Hard mask layer 66 may be formed of materials including, but not limited to, chromium, chromium nitride, nickel, platinum, vanadium, and/or the like. Hard mask layer 66 may have a thickness $t_6$. Thickness $t_6$ may be between approximately 1-20 nm. For example, hard mask layer 66 may have a thickness $t_6$ of approximately 5 nm.

Figure 6:
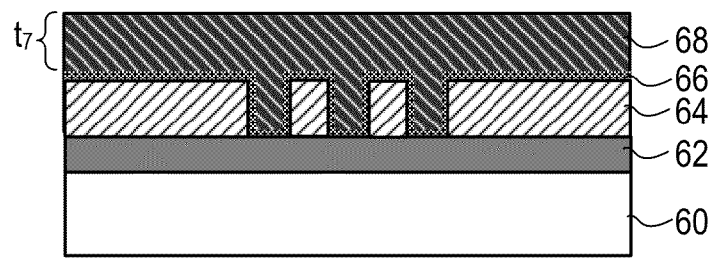

Referring to FIG. 6, planarizing layer 68 may be disposed on resist layer 64 and/or hard mask layer 66 to provide for a substantially planar top surface. Planarizing layer 68 may be disposed by processes including, but not limited to, spin-coating, evaporation, sputtering, chemical vapor deposition (CVD), and the like. Alternatively, planarizing layer 68 may be disposed in an imprint step such that a planar topography may be molded from an unpatterned surface of template 18. Imprint techniques may provide for planar surfaces with minimal dependence on pattern density of underlying features 70.

Materials used to form planarizing layer 68 are generally selected to provide little or no significant alterations to resist layer 66 and/or features 70 of resist layer 66. Planarizing layer 68 may be formed of materials including, but not limited to, organic imprint resist material, silicon-containing imprint resist material, spin-on dielectric materials, silsesquioxane materials, sol-gel materials, siloxane materials, bilayer resist materials, and/or the like. Planarizing layer 68 may have a thickness $t_7$. Thickness $t_7$ may be between approximately 20 to 200 nm or other suitable range in order to provide for a substantially planar top surface. For example, planarizing layer 68 may have a thickness $t_7$ of approximately 100 nm.

Figure 7:
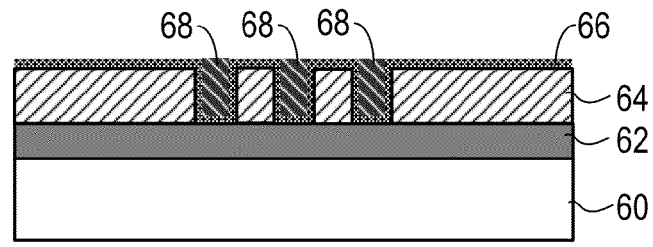

Referring to FIG. 7, planarizing layer 68 may be etched until planarizing layer 68 is substantially removed in un-patterned regions. Etching may be performed in plasma containing oxygen, argon, and/or fluorocarbon.

Figure 8:
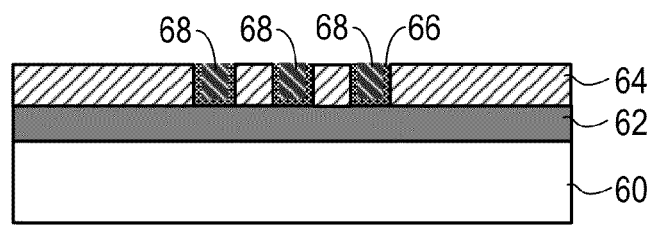

Referring to FIG. 8, hard mask layer 66 may be plasma etched until hard mask layer 66 is substantially removed in un-patterned regions. In one example, hard mask layer 66 may be etched in plasma containing chlorine and/or oxygen. It should be noted that the etching of planarizing layer 68 and the etching of hard mask layer 66 may be performed in a single step process.

Etching of hard mask layer 66 and/or planarizing layer 68 may be monitored. For example, etching of hard mask layer 66 and/or planarizing layer 68 may be monitored by a reflectance probe (e.g., laser reflectance probe). The reflectance probe may measure reflectance loss as hard mask layer 66 and/or planarizing layer 68 are removed.

Figure 9A:
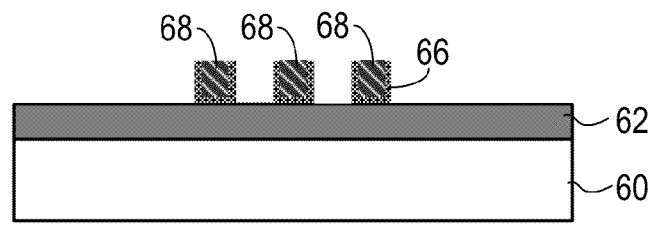
Figure 9B:
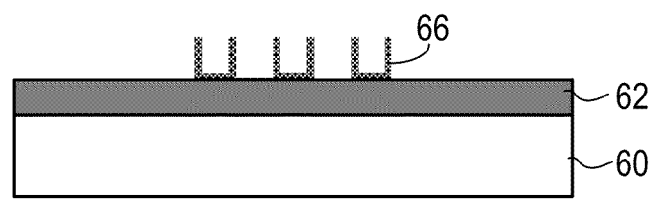
Figure 9C:
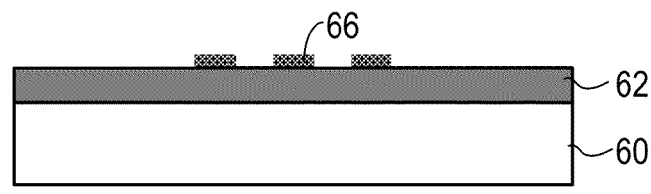

Referring to FIGS. 9A-C, resist layer 64 may be removed. For example, resist layer 64 may be removed by dissolution in a solvent as illustrated in FIG. 9A. Additionally, as shown in FIGS. 9B and 9C, removal of resist layer 64 may result in removal of planarizing layer 68.

Exemplary solvents for dissolution of resist layer 64 include, but are not limited to, dichloromethane, diemthylacetamide, N-methylpyrrolidone, and the like. In one example, resist layer 64 is removed using a plasma etch. For example, resist layer 64 may be removed in plasma containing oxygen and/or argon.

Plasma etching of fused silica, silicon dioxide, and refractory metals is generally an ion-enhanced process. As such, the process may provide for etching of the surface of such materials to provide surface chemical reactions that may result in the removal of these materials. Generally, plasma conditions that produce this effect may involve high RF power and/or lower process chamber pressure. These conditions may result in unwanted erosion or a higher rate of erosion of materials than may be needed. For example, in certain circumstances, hard mask layer 66 may have a thickness $t_6$ substantially less than 15 nm. Application of high RF power and/or lower pressure may substantially erode hard mask layer 66 and may result in deformation during pattern transfer (e.g., pattern critical dimension consistencies and/or poor profile control).

Figure 13:
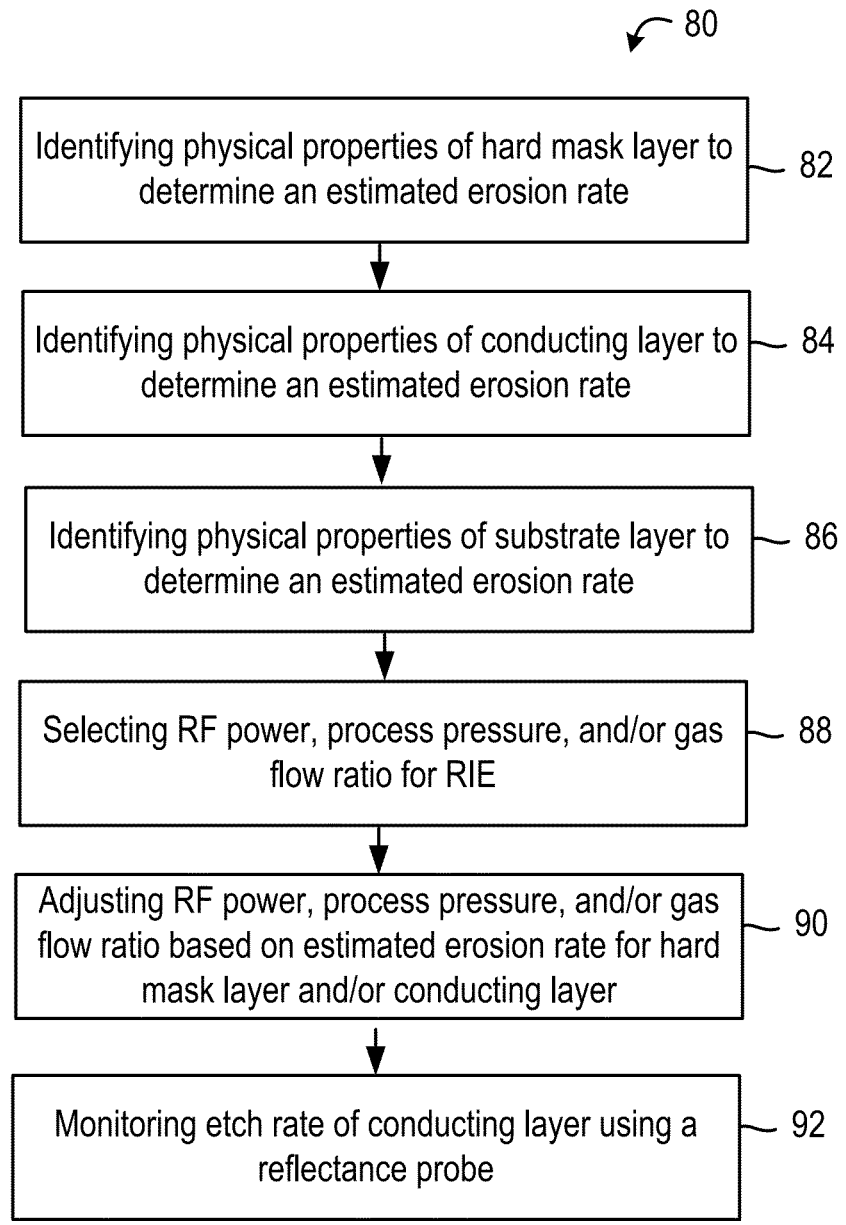
FIG. 13 illustrates a flow chart of an exemplary method for etching a first material while substantially maintaining a second material.

FIG. 13 illustrates a flow chart of a method 80 for etching conducting layer 62 (e.g., tantalum) while substantially maintaining hard mask layer 66 (e.g., chromium). For example, method 80 may reduce erosion rate of hard mask layer 66 (e.g., <1 nm/min) while maintaining a suitable erosion rate for conducting layer 62 (e.g., >1 nm/min). In a step 82, physical properties of hard mask layer 66 may be identified for determination of an estimated erosion rate for hard mask layer 66. For example, thickness $t_6$ of hard mask layer 66 may be identified to determine the estimated erosion rate for hard mask layer 66. In a step 84, physical properties of conducting layer 62 may be identified for determination of an estimated erosion rate for conducting layer 62. For example, thickness $t_4$ may be identified for determination of the estimated erosion rate for conducting layer 62. In a step 86, physical properties of substrate layer 60 (e.g. quartz) may be identified for evaluation of depth desired for pattern transfer (e.g., approximately 10-100 nm). In a step 88, RF power, process pressure, and/or gas flow ratio (e.g., $CF_4$/helium gas flow ratio) within a commercially available reactive ion etch (RIE) plasma processing system may be selected. In a step 90, RF power, process pressure, and/or gas flow ratio may be adjusted based on the estimated erosion rate for hard mask layer 66 and/or conducting layer 62. In a step 92, etch rate of conducting layer 62 may be monitored by a reflectance probe to provide substantially consistent results in patterning of substrate layer 60.

Figure 14A:
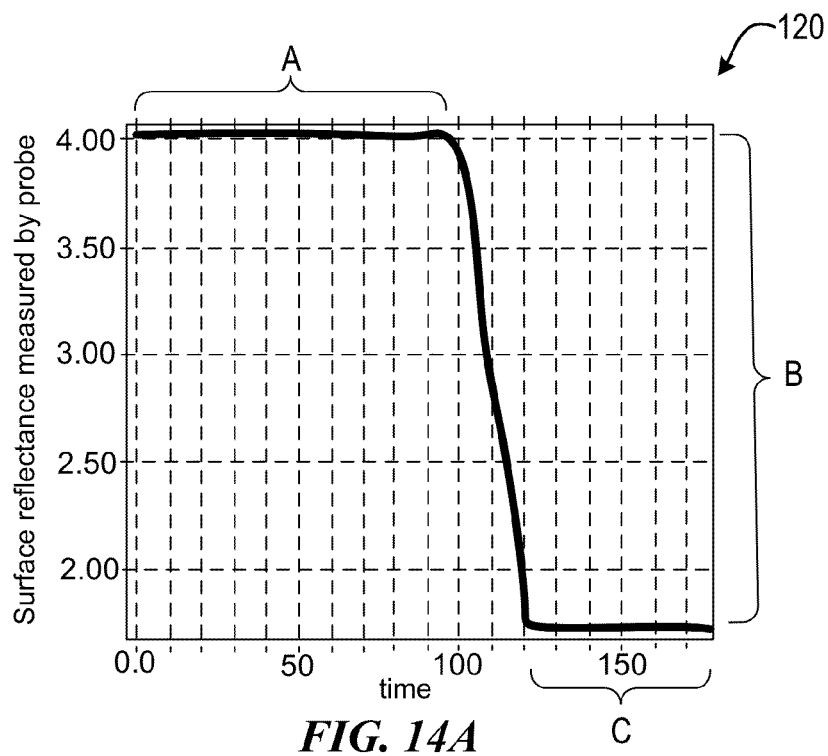
FIGS. 14A and 14B illustrate exemplary graphs showing variation of reflectance intensity as an RIE etch process proceeds through layers of material.
Figure 14B:
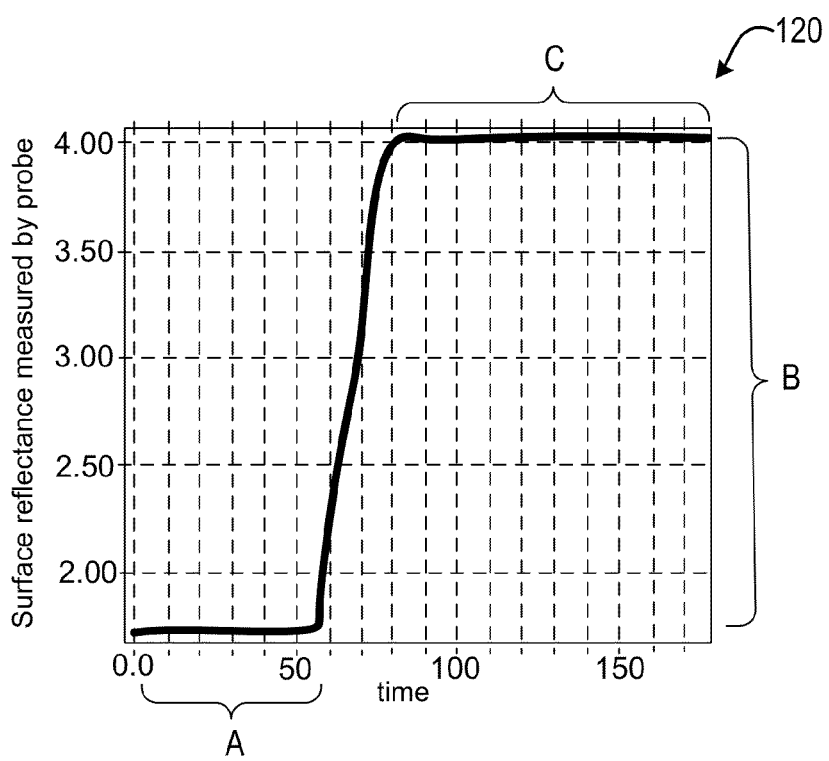

The reflectance probe may be any apparatus that provides information regarding surface reflectance of a material over time. For example, reflectance probe may be a laser source that is integrated into a video camera and/or reflectance sensor module. The etch rate of conducting layer 62 may be monitored by the reflectance probe to provide a surface reflectance graph. Exemplary reflectance graphs 120 are illustrated in FIGS. 14A and 14B. Graphs 120 provide the surface reflectance of at least two materials over time. Section A illustrates the surface reflectance of a first material (e.g., conducting layer 62) at the beginning of the etch process. Section B illustrates surface reflectance of the first material as the etch process continues. Section C illustrates surface reflectance of a second material (e.g., substrate layer 60) once the first material is removed from the area being monitored. Surface reflectance between the first material and the second material may differ substantially or minimally. Additionally, the surface reflectance of the first material may be more than the surface reflectance of the second material (as shown in FIG. 14A) or less than the surface reflectance of the second material (as shown in FIG. 14B). Additionally, a targeted etch time for substrate layer 62 may be determined based on surface reflectance between Section B and Section C of graph 120. For example, between samples, thickness $t_4$ of conducting layer 62 may vary. A standardized etch rate for substrate layer 62 with multiple conducting layers 62 may result in inconsistent etch depth within substrate layer 62. As such, a targeted etch time may be developed for substrate layer 62 having a starting point at the transition of Section B and Section C of graph 120. The targeted etch time may remove thickness of conducting layer 62 in standardizing the pattern depth in substrate layer 62.

The above identified method for etching conducting layer 62 while substantially maintaining hard mask layer 66 and monitoring etching of two or more materials may be used in additional processes such as those described in U.S. Ser. No. 11/856,862 and U.S. Ser. No. 11/943,907, both of which are hereby incorporated by reference herein.

Figure 10:
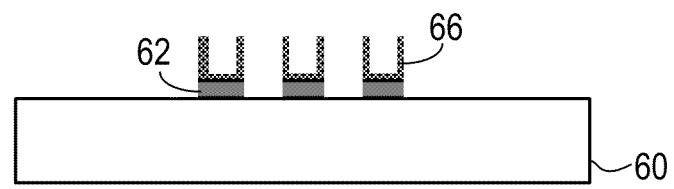

Referring to FIG. 10, hard mask layer 66 may be used as an etch mask to create topography in underlying substrate layer 60. Substrate layer 60 may be etched using a fluorocarbon plasma etch process. Etch time may be determined by graph 120 of FIG. 14A, as described in further detail herein.

Figure 11:
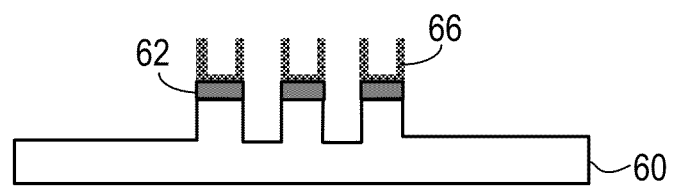
Figure 12:
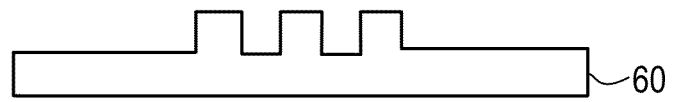

Referring to FIG. 11, cleaning process may be performed to remove residual resist layer 64, planarizing layer 68, and/or conducting layer 64. For example, substrate layer 60 may be immersed in a piranha solution (e.g., $H_2SO_4$ and $H_2O_2$). Hard mask layer 66 may be removed using an aqueous solution containing ceric ammonium nitride. Conducting layer 64 may be removed using a vapor containing xenon difluoride.

What is claimed is:

1. A method of forming an imprint lithography template comprising:
   providing a substrate layer;
   disposing a conducting layer on the substrate layer, the conducting layer associated with a first erosion rate;
   forming a resist layer over the conducting layer;
   patterning the resist layer;
   disposing a hard mask layer over at least a portion of the patterned resist layer, the hard mask layer associated with a second erosion rate;

forming a planarizing layer having a substantially planar top surface over the hard mask layer and the patterned resist layer;
etching the planarizing layer and hard mask layer until the planarizing layer and hard mask layer are substantially removed from unpatterned regions on the conducting layer;
removing the resist layer;
altering the second erosion rate of the hard mask layer to a third erosion rate while maintaining the first erosion rate of the conducting layer, the third erosion rate less than the second erosion rate;
etching, based on the altering, the conducting layer while substantially maintaining the remaining hard mask layer in patterned regions; and,
etching the substrate to provide an inverse of the patterned resist layer in the substrate at a standardized pattern depth.

2. The method of claim 1 wherein the substrate layer is formed of a material selected from the group consisting of quartz, silicon, organic polymers, borosilicate glass, fluorocarbon poly, organic polymers, borosilicate glass, fluorocarbon polymers, and hardened sapphire.

3. The method of claim 1 wherein the conducting layer is formed of a material selected from the group consisting of tantalum, tantalum nitride, tantalum silicide, tungsten, tungsten nitride, silicon carbide, amorphous silicon, chromium, chromium nitride, molybdenum, molybdenum silicide, titanium, and titanium nitride.

4. The method of claim 1 wherein the conducting layer has a thickness of approximately 10 nm or less.

5. The method of claim 1 wherein the conducting layer has a thickness of approximately 5 nm or less.

6. The method of claim 1 wherein the resist layer is formed of a material selected from the group consisting of imprint resists, novolac-type photoresists, acrylate photoresists, epoxy photoresists, bilayer resists, and positive-tone electron beam resists.

7. The method of claim 1 wherein the resist layer has a thickness of approximately 5 to 150 nm.

8. The method of claim 1 wherein patterning the resist layer further comprises using an electron beam lithography tool.

9. The method of claim 1 wherein the hard mask layer is formed on the entirety of the patterned surface.

10. The method of claim 1 wherein the hard mask layer is formed of material selected from the group consisting of chromium, chromium nitride, nickel, platinum, and vanadium.

11. The method of claim 1 wherein the hard mask layer has a thickness of approximately 15 nm or less.

12. The method of claim 1 wherein the hard mask layer has a thickness of approximately 5 nm or less.

13. The method of claim 1 wherein the planarizing layer is formed of material selected from the group consisting of organic imprint resists, silicon-containing imprint resists, spin-on dielectrics, silsequioxanes, sol-gel materials, siloxanes, and bilayer resists.

14. The method of claim 1 wherein etching the conducting layer is monitored by reflectance of the conducting layer.

15. The method of claim 1 further comprising:
selecting a process pressure for a reactive ion etching process for etching the hard mask layer and the conducting layer;
adjusting the process pressure during the reactive ion etching process based on the second erosion rate of the hard mask layer and the first erosion rate of the conducting layer; and,
monitoring a reflectance of the conducting layer to provide substantially uniform erosion of the conducting layer.

16. The method of claim 15, further comprising:
selecting a RF power for the reactive ion etching process; and,
adjusting the RF power during the reactive ion etching process based on the the second erosion rate of the hard mask layer and the first erosion rate of the conducting layer.

17. The method of claim 15, further comprising:
selecting a gas flow rate for the reactive ion etching process; and,
adjusting the gas flow rate during the reactive ion etching process based on the the second erosion rate of the hard mask layer and the first erosion rate of the conducting layer.

18. The method of claim 1, further comprising:
monitoring the reflectance of the conducting layer and the reflectance of the substrate to determine a targeted etch time for etching the substrate based on the desired pattern transfer depth.

19. The method of claim 1 wherein the hard mask layer is chromium and the conducting layer is tantalum.

20. A method of forming an imprint lithography template comprising:
providing a substrate layer;
disposing a conducting layer on the substrate layer, the conducting layer associated with a first erosion rate;
forming a resist layer over the conducting layer;
patterning the resist layer to provide patterned regions and unpatterned regions;
disposing a hard mask layer over at least a portion of the patterned resist layer, the hard mask layer associated with a second erosion rate
forming a planarizing layer having a substantially planar top surface over the hard mask layer and the patterned resist layer;
etching the planarizing layer and hard mask layer until the planarizing layer and hard mask layer are substantially removed from unpatterned regions on the conducting layer;
removing the resist layer to expose one or more portions of the conducting layer within the unpatterned regions, and to provide one or more protrusions within the patterned regions, the one or more protrusions including portions of the hard mask layer;
altering the second erosion rate of the hard mask layer to a third erosion rate while maintaining the first erosion rate of the conducting layer, the third erosion rate less than the second erosion rate;
etching, based on the altering, the conducting layer to remove the exposed portions of the conducting layer while substantially maintaining the one or more protrusions; and,
etching the substrate to provide an inverse of the patterned resist layer in the substrate at a standardized pattern depth.

* * * * *